(12) United States Patent
Park et al.

(10) Patent No.: US 8,030,123 B2
(45) Date of Patent: Oct. 4, 2011

(54) ORGANIC LIGHT EMISSION DISPLAY AND FABRICATION METHOD OF THE SAME

(75) Inventors: Moon-Hee Park, Yongin-si (KR); Kyoung-Wook Min, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 884 days.

(21) Appl. No.: 11/696,138

(22) Filed: Apr. 3, 2007

(65) Prior Publication Data

US 2008/0108173 A1 May 8, 2008

(30) Foreign Application Priority Data

Nov. 3, 2006 (KR) .................. 10-2006-0108236

(51) Int. Cl.
*H01L 51/40* (2006.01)
(52) U.S. Cl. .................. 438/99; 257/E51.003
(58) Field of Classification Search .......... 438/99; 257/40, E51.003
See application file for complete search history.

(56) References Cited

U.S. PATENT DOCUMENTS

| | | | | |
|---|---|---|---|---|
| 7,843,135 B2 * | 11/2010 | Heo | | 313/512 |
| 2002/0170175 A1 * | 11/2002 | Aigner et al. | | 29/884 |
| 2002/0179986 A1 * | 12/2002 | Orcutt et al. | | 257/417 |
| 2004/0191566 A1 * | 9/2004 | Kikuchi et al. | | 428/690 |
| 2004/0211966 A1 * | 10/2004 | Guenther et al. | | 257/79 |
| 2005/0062056 A1 * | 3/2005 | Baugh et al. | | 257/98 |
| 2005/0064780 A1 * | 3/2005 | Auch et al. | | 445/25 |
| 2006/0001114 A1 * | 1/2006 | Chen et al. | | 257/415 |
| 2007/0190691 A1 * | 8/2007 | Humpston et al. | | 438/113 |
| 2007/0269934 A1 * | 11/2007 | Thompson et al. | | 438/127 |
| 2007/0290282 A1 * | 12/2007 | Belov et al. | | 257/421 |

FOREIGN PATENT DOCUMENTS

KR 10-2005-0077923 8/2005

OTHER PUBLICATIONS

Korean Patent Abstracts, Publication No. 1020050077923A, dated Aug. 4, 2005, in the name of Moon Hee Park et al.

* cited by examiner

*Primary Examiner* — Kiesha Bryant
*Assistant Examiner* — Igwe U Anya
(74) *Attorney, Agent, or Firm* — Christie, Parker & Hale, LLP

(57) ABSTRACT

An organic light emission display and a fabrication method thereof. According to one embodiment of the present invention, a fabrication method of an organic light emission display includes: forming a light emitting part on a first area of a substrate and a pad part on a second area of the substrate; forming a sealing substrate by etching an area of the sealing substrate corresponding to the light emitting part and etching an area of the sealing substrate corresponding to the pad part; and sealing the light emitting part by attaching the substrate to the sealing substrate.

5 Claims, 2 Drawing Sheets

ORGANIC LIGHT EMISSION DISPLAY AND FABRICATION METHOD OF THE SAME

CROSS-REFERENCE TO RELATED APPLICATION

This application claims priority to and the benefit of Korean Patent Application No. 10-2006-0108236, filed in the Korean Intellectual Property Office on Nov. 3, 2006, the entire content of which is incorporated herein by reference.

BACKGROUND OF THE INVENTION

1. Field of the Invention

The present invention relates to an organic light emission display and a fabrication method thereof.

2. Description of the Related Art

An organic light emission display is a self emission type of display using a phenomenon in which electrons and holes injected through a cathode and an anode, respectively, are recombined in an organic material to form excitons, and energy is discharged by the excitons to generate a specific wavelength of light.

As compared with a liquid crystal display, an organic light emission display does not require a separate light source such as a backlight and has a low power consumption, a wide viewing angle, and a fast response speed.

A light emitting element of the organic light emission display includes an anode electrode for injecting holes, an organic thin film layer, and a cathode electrode for injecting electrons. In addition, the organic thin film layer includes organic materials that emit R (red), G (green), and B (blue) light, respectively.

Furthermore, the organic thin film layer may include an emitting layer (EML), an electron transport layer (ETL), and a hole transport layer (HTL) to enhance emission efficiency by improving a balance between electrons and holes. In addition, if needed, the organic thin film layer may further include a separate electron injection layer (EIL) and a hole injection layer (HIL).

In one embodiment, the organic light emission display is fabricated by forming a light emitting part having a light emitting element on a substrate, forming a pad part having a wire line formed thereon, and sealing the substrate with a sealing substrate. A unit cell is formed by scribing the sealed display, and a process is performed for exposing the pad part such that it may be connected to an external circuit (or circuit board) such as a flexible printed circuit (FPC).

However, during such a scribing process, one or more glass chips may be formed, such that the pad part becomes scratched by the glass chips. The scratch (or scratches) on the pad part may cause the organic light emission display to malfunction.

SUMMARY OF THE INVENTION

An aspect of the present invention provides an organic light emission display in which a risk of malfunction is reduced by preventing a pad part from being scratched due to a glass chip produced in a scribing process.

According to one embodiment of the present invention, a fabrication method of an organic light emission display includes: forming a light emitting part on a first area of a substrate and a pad part on a second area of the substrate; forming a sealing substrate by etching an area of the sealing substrate corresponding to the light emitting part and etching an area of the sealing substrate corresponding to the pad part; and sealing the light emitting part by attaching the substrate to the sealing substrate.

In addition, the method may further include forming a unit cell by scribing the sealing substrate and removing a portion of the sealing substrate corresponding to the pad part to expose the pad part.

The forming the sealing substrate may further include line-etching an inside portion of the sealing substrate at the etched area of the sealing substrate corresponding to the pad part.

According to another embodiment of the present invention, an organic light emission display includes a substrate having a light emitting part and a pad part formed thereon and a sealing substrate for covering the light emitting part and being attached to the substrate. The sealing substrate includes a protruded part formed at a side of the sealing substrate corresponding to the pad part. The protruded part may include a substantially uneven end surface.

According to another embodiment of the present invention, a sealing substrate includes a first space formed on an area corresponding to a positioning of a light emitting part on a substrate and a second space formed on an area corresponding to a positioning of a pad part on the substrate. The sealing substrate includes an inside opening formed in the second space such that a scribing of the sealing substrate is performed easily.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, only certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, and not restrictive.

A method of fabricating an organic light emission display according to an embodiment of the present invention includes forming a light emitting part and a pad part on a substrate, forming a sealing substrate, and attaching the sealing substrate to the substrate.

Figure 1A:
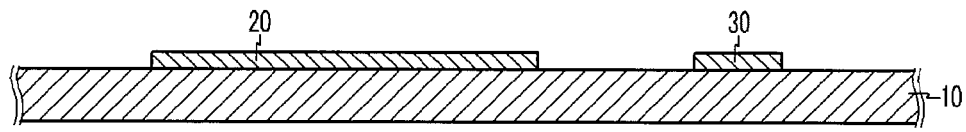
FIGS. 1A, 1B, 1C, 1D and 1E are views showing a fabrication method of an organic light emission display according to embodiments of the present invention.

As shown in FIG. 1A, a substrate 10 is prepared (or provided). A light emitting part 20 is formed on an area of the substrate 10, and a pad part 30 is formed on another area of the substrate 10.

The light emitting part 20 may include a plurality of light emitting elements. In more detail, each of the light emitting elements may have a structure formed by sequentially stacking a first electrode, an organic thin film layer, and a second electrode. In more detail, the first electrode may be an anode electrode, and the second electrode may be a cathode electrode.

The organic thin film layer may be made of a low or high molecule organic material. The organic thin film layer made of the low molecule organic material may have a multi-layered structure including a hole injection layer (HIL), a hole transport layer (HTL), an emitting layer (EML), and an electron transport layer (ETL).

Alternatively, the organic thin film layer made of the high molecule organic material may include an HTL and an EML. The HTL may be made of a conductive polyethylene dioxythiophene (PEDOT) material, and the EML may be made of a poly-phenylenevinylene (PPV) and/or a polyfluorene material.

In more detail, the pad part 30 may include a plurality of wire lines for applying a current and/or a voltage to the light emitting part 20.

Figure 1B:
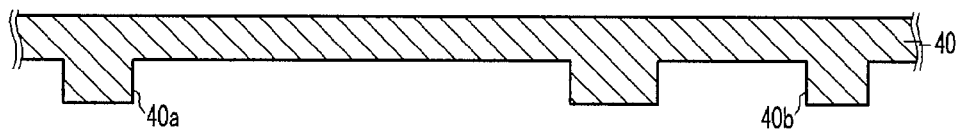

As shown in FIG. 1B, in one embodiment, a sealing substrate 40 is formed by etching a glass substrate. In more detail, a first space (or opening) 40a and a second space (or opening) 40b are formed on a surface of the glass substrate by etching an area corresponding to a positioning of the light emitting part 20 on the substrate 10 and an area corresponding to a positioning of the pad part 30 on the substrate 10, respectively. The first space 40a may be sized such that the light emitting part 20 may be disposed therein, and the second space 40b may be sized such that the pad part 30 may be disposed therein.

Figure 1C:
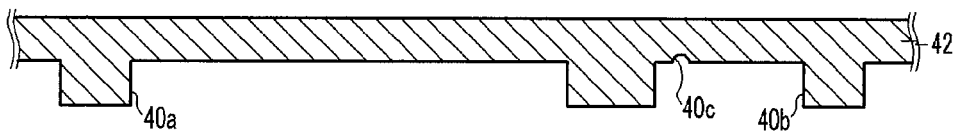

As shown in FIG. 1C, the second space 40b may be cut (e.g., by line-etching) to form an inside portion (or opening) 40c therein. A cut (or line-etched) sealing substrate 42 is thereby formed. As such, as will be described in more detail below, a scribing process can be more efficiently performed.

Figure 1D:
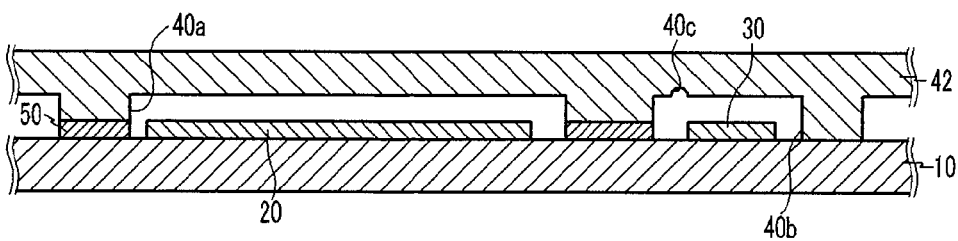

As shown in FIG. 1D, the light emitting part 20 is sealed by attaching the sealing substrate 42 to the substrate 10. In one embodiment, the sealing substrate 42 and the substrate 10 are attached to each other with a sealant 50.

Figure 1E:
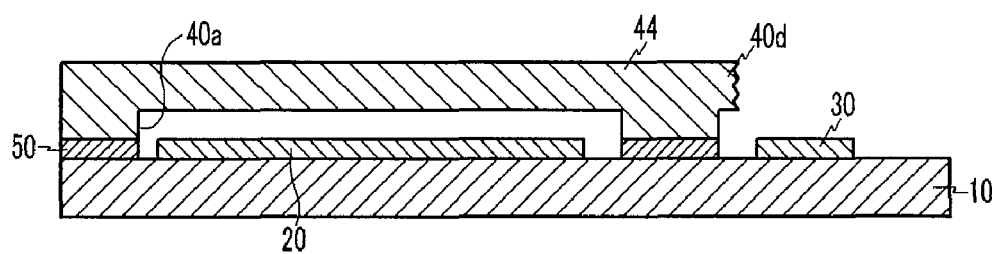

Also, a portion of the sealing substrate 42 located above the pad part 30 is scribed. In one embodiment, the portion of the sealing substrate 42 that is scribed corresponds to a positioning of the inside opening 40c such that the scribing can be performed more easily. Then, the scribed portion of the sealing substrate 42 is separated from a portion of the sealing substrate 42 still attached to the substrate 10. In one embodiment, the scribed portion of the sealing substrate 42 is pulled away from the portion of the sealing substrate 42 still attached to the substrate 10. A unit cell of an organic light emission display is formed by scribing the substrate 10 and the sealing substrate 40. Not shown in the drawings, a plurality of unit cell may also be formed by scribing the substrate 10 and the sealing substrate 40. FIG. 1E shows an organic light emission display fabricated by the above processes.

Here, a protruded part 40d may be formed in the portion of the sealing substrate 44 still attached to the substrate 10 to have a scribed cross-section, i.e., a substantially uneven end surface.

Here, glass chips may be generated (or produced) in a process in which a part of the sealing substrate 42 made of glass is removed to expose the pad part 30. In addition, such glass chips may also be produced in a process in which the sealing substrate 42 is scribed to form the unit cell.

However, due to the second space 40b, the glass chips produced are not in contact with the pad part 30 during the process in which the scribed portion of the sealing substrate 42 is pulled to be removed, such that pad part 30 does not become scratched due to the glass chips.

Because the pad part 30 does not become scratched, a probability that the organic light emission display will malfunction is reduced.

As described above, according to embodiments of the present invention, there is provided an organic light emission display for which the probability of malfunction is reduced by preventing a pad part from being scratched due to glass chips formed during a process for scribing a sealing substrate.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A fabrication method of an organic light emission display, the method comprising:
    forming a light emitting part on a first area of a substrate and a pad part on a second area of the substrate;
    forming a sealing substrate by etching an area of the sealing substrate corresponding to the light emitting part and etching an area of the sealing substrate corresponding to the pad part;
    sealing the light emitting part by attaching the substrate to the sealing substrate,
    forming a unit cell by scribing the sealing substrate and the substrate; and
    removing a portion of the sealing substrate corresponding to the pad part to expose the pad part,
    wherein the forming the sealing substrate further comprises line-etching an inside portion of the sealing substrate at the etched area of the sealing substrate corresponding to the pad part.

2. The method of claim 1,
    wherein the forming the unit cell by scribing the sealing substrate and the substrate comprises scribing the sealing substrate at a periphery of the area of the sealing substrate corresponding to the pad part; and
    wherein the removing the portion of the sealing substrate corresponding to the pad part to expose the pad part comprises removing the portion of the sealing substrate located above the pad part to expose the pad part.

3. The method of claim 2,
    wherein the forming the sealing substrate further comprises line-etching an inside portion of the sealing substrate at the etched area of the sealing substrate corresponding to the pad part, and
    wherein the scribing the sealing substrate at the periphery of the area of the sealing substrate corresponding to the pad part comprises scribing the sealing substrate at a position corresponding to the line-etched inside portion of the sealing substrate.

4. The method of claim 1, wherein the sealing substrate is a glass substrate.

5. The method of claim 1, wherein the substrate is attached to the sealing substrate via a sealant.

* * * * *